United States Patent
Tsai et al.

(10) Patent No.: US 8,208,598 B2
(45) Date of Patent: *Jun. 26, 2012

(54) SHIFT REGISTER

(75) Inventors: Yi-Cheng Tsai, Chiayi County (TW);
Wen-Chun Wang, Taichung (TW);
Hsi-Rong Han, Taichung County (TW);
Chien-Ting Chan, Changhua County (TW)

(73) Assignee: Wintek Corporation, Taichung (TW)

( * ) Notice: Subject to any disclaimer, the term of this patent is extended or adjusted under 35 U.S.C. 154(b) by 760 days.

This patent is subject to a terminal disclaimer.

(21) Appl. No.: 12/275,455

(22) Filed: Nov. 21, 2008

(65) Prior Publication Data

US 2009/0128541 A1 May 21, 2009

(30) Foreign Application Priority Data

Nov. 21, 2007 (TW) .................................. 96144169 A

(51) Int. Cl.
*G11C 19/00* (2006.01)
(52) U.S. Cl. ............................... 377/64; 377/78; 377/79
(58) Field of Classification Search .......................... None
See application file for complete search history.

(56) References Cited

U.S. PATENT DOCUMENTS

| | | | |
|---|---|---|---|
| 6,970,530 B1 * | 11/2005 | Wang et al. | 377/69 |
| 7,400,698 B2 * | 7/2008 | Chang et al. | 377/64 |
| 7,697,655 B2 * | 4/2010 | Chan et al. | 377/64 |
| 7,778,379 B2 * | 8/2010 | Liao et al. | 377/64 |
| 8,018,423 B2 * | 9/2011 | Tsai et al. | 345/100 |
| 2006/0291610 A1 * | 12/2006 | Lo et al. | 377/64 |
| 2010/0150301 A1 * | 6/2010 | Chan et al. | 377/64 |
| 2010/0245300 A1 * | 9/2010 | Chan et al. | 345/204 |

* cited by examiner

*Primary Examiner* — Tuan T Lam
(74) *Attorney, Agent, or Firm* — Thomas|Kayden

(57) ABSTRACT

A shift register comprises many stages, and each of stages comprises a first, a second and a third level control unit and a first and a second control unit is provided. The first and the second level control unit respectively provides a first clock signal and a voltage to an output terminal. The first driving unit and the level control unit are coupled to a first node. The first driving unit turns on and turns off the first level control unit in response to an input signal, a second control signal and a first control signal of the next stage. The second driving unit turns on and turns off the second level control unit in response to the first control signal. The third level control unit provides a first voltage to the output terminal in response to the second control signal and the first control signal.

10 Claims, 15 Drawing Sheets

SHIFT REGISTER

This application claims the benefit of Taiwan application Serial No. 96144169, filed Nov. 21, 2007, the subject matter of which is incorporated herein by reference.

BACKGROUND OF THE INVENTION

1. Field of the Invention

The invention relates in general to a shift register, and more particularly to a shift register used in a double-sided scan driver.

2. Description of the Related Art

With the rapid advance in science and technology, liquid crystal display (LCD) has been widely used in the displays of electronic products such as TV, computer, notebook computer, mobile phone, personal digital assistant (PDA) and so on. The LCD comprises a data driver, a scan driver and an LCD panel. The LCD panel has a pixel array. The scan driver sequentially turns on corresponding pixel rows of the pixel arrays so as to scan the pixel data outputted by the data driver to the pixels for displaying an image.

According to most of current technologies, the scan driver capable of sequentially turning on corresponding pixel rows of a pixel array is embodied by a shift register. As the double-sided scan driver effectively reduces the bezel area of LCD panel, how to develop a shift register having the advantages of being applicable to double-sided scan driver and having a longer lifespan but lighter scan signal distortion has become an important issue to the manufacturers.

SUMMARY OF THE INVENTION

The invention is directed to a shift register applicable to a double-sided scan driver and having the advantages of longer lifespan and lighter distortion in scan signals.

According to a first aspect of the present invention, a shift register used in a double-sided scan driver is provided. The shift register comprises many stages, and each stage comprises a first, a second, a third level control unit, and a first and a second driving unit. The first level control unit provides a first clock signal to an output terminal. The first driving unit is coupled to an input terminal of the first level control unit via a first node, the voltage in the first node is a first control signal. The first driving unit turns on the first level control unit in response to the front edge of an input signal and turns off the first level control unit when the level of the first control signal of the next stage is higher than the level of the second control signal. The second level control unit provides a first voltage to an output terminal. The second driving unit turns off the second level control unit in response to the front edge of the first control signal and turns on the second level control unit in response to the rear edge of the first control signal. The third level control unit provides a first voltage to an output terminal when the level of the first control signal is higher than the level of the second control signal. When both the signal at the output terminal and the first control signal are at high levels, the second control signal is also at a high level.

The invention will become apparent from the following detailed description of the preferred but non-limiting embodiments. The following description is made with reference to the accompanying drawings.

DETAILED DESCRIPTION OF THE INVENTION

First Embodiment

Figure 1:
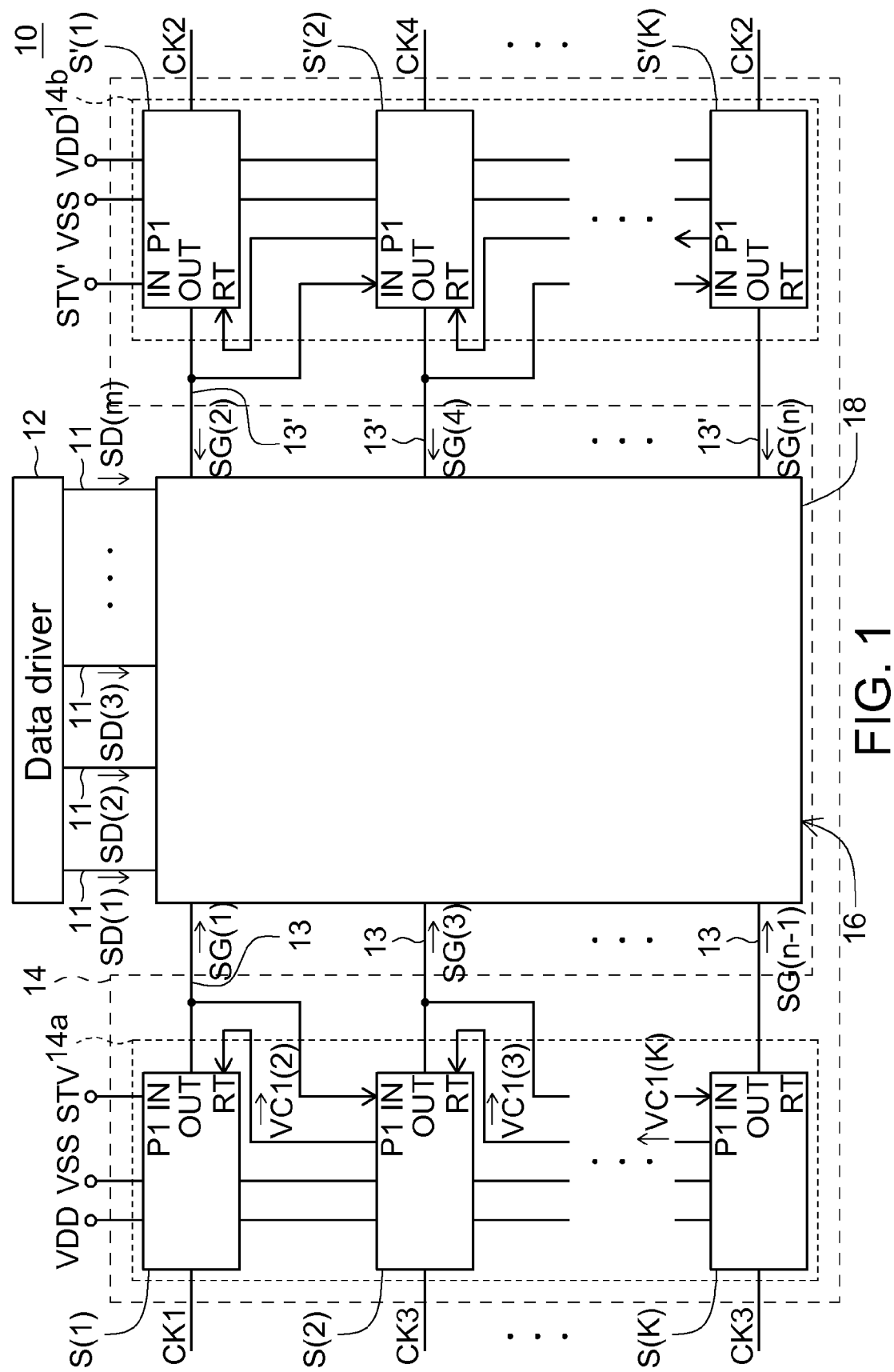
FIG. 1 is a block diagram of an LCD of a shift register according to a first embodiment of the invention.

Referring to FIG. 1, a block diagram of an LCD of a shift register according to a first embodiment of the invention is shown. The LCD 10 comprises a data driver 12, a scan driver 14 and an LCD panel 16. The LCD panel 16 comprises a pixel array 18 whose dimension is m×n for example, wherein both n and m are a natural number larger than 1.

The data driver 12 provides m data signals SD(1)~SD(m) to the pixel array 18 via a data line 11. The scan driver 14 is exemplified by a double-sided scan driver comprising shift registers 14a and 14b. The shift registers 14a and 14b located on two sides of the LCD panel 16 respectively provides the scan signals of odd-numbered rows of the scan signals SG(1)~SG(n) and the scan signals of even-numbered rows of the scan signals SG(1)~SG(n) to the pixel array 18 via the scan lines 13 and 13'.

The shift registers 14a and 14b respectively comprises multiple stages of shift register S(1)~S(k) and stages of shift register S'(1)~S'(k), wherein the structures of the stages S(1)~S(k) is identical to that of the stages S'(1)~S'(k). The circuit structures of the stages S(1)~S(k) are exemplified below, wherein k is a natural number. The stages S(1)~S(k) are serially connected and are respectively used to produce the scan signals SG(1), SG(3), SG(5), . . . SG(n-1) of odd-numbered rows to drive the pixels in the odd-numbered rows of the n rows of the pixel array 18. From the perspective of the stages S(1)-S(k), S(2) is the next stage of the S(1) and outputs scan signal SG(3), S(3) is the next stage of S(2) and outputs scan signal SG(5). On the other hand, S'(2) is the next stage of the S'(1) and outputs scan signal SG(2), S'(3) is the next stage of S'(2) and outputs scan signal SG(4) from the perspective of the stages S'(1)-S'(k). In other words, odd-number stages S(1)-S(k) provide scan signals SG(1), SG(3), SG(5) . . . and even-number stages S'(1)-S'(k) provide scan signals SG(2), SG(4), SG(6) . . . for LCD panel 10.

Each of the stages S(1)~S(k) comprises an input terminal IN, an output terminal OUT, a control terminal RT and a clock terminal C. The input terminal IN of the stage S(1) receives an initial signal STV. The input terminals IN of the stages S(2)~S(k) sequentially receive the scan signals SG(1)~SG(n-2) outputted from the output terminal OUT of previous stage shift register. Of the stages S(1)~S(k), the clock terminals C of the odd-numbered stage shift registers units and the clock terminals C of the even-numbered stage stages respectively receive a clock signal CK1 and a clock signal CK3. The control terminals RT of the stages S(1)~S(k-1) respectively receive the control signals VC1(2)~VC1(K) at the node P1 of the stages S(2)~S(k).

Figure 2:
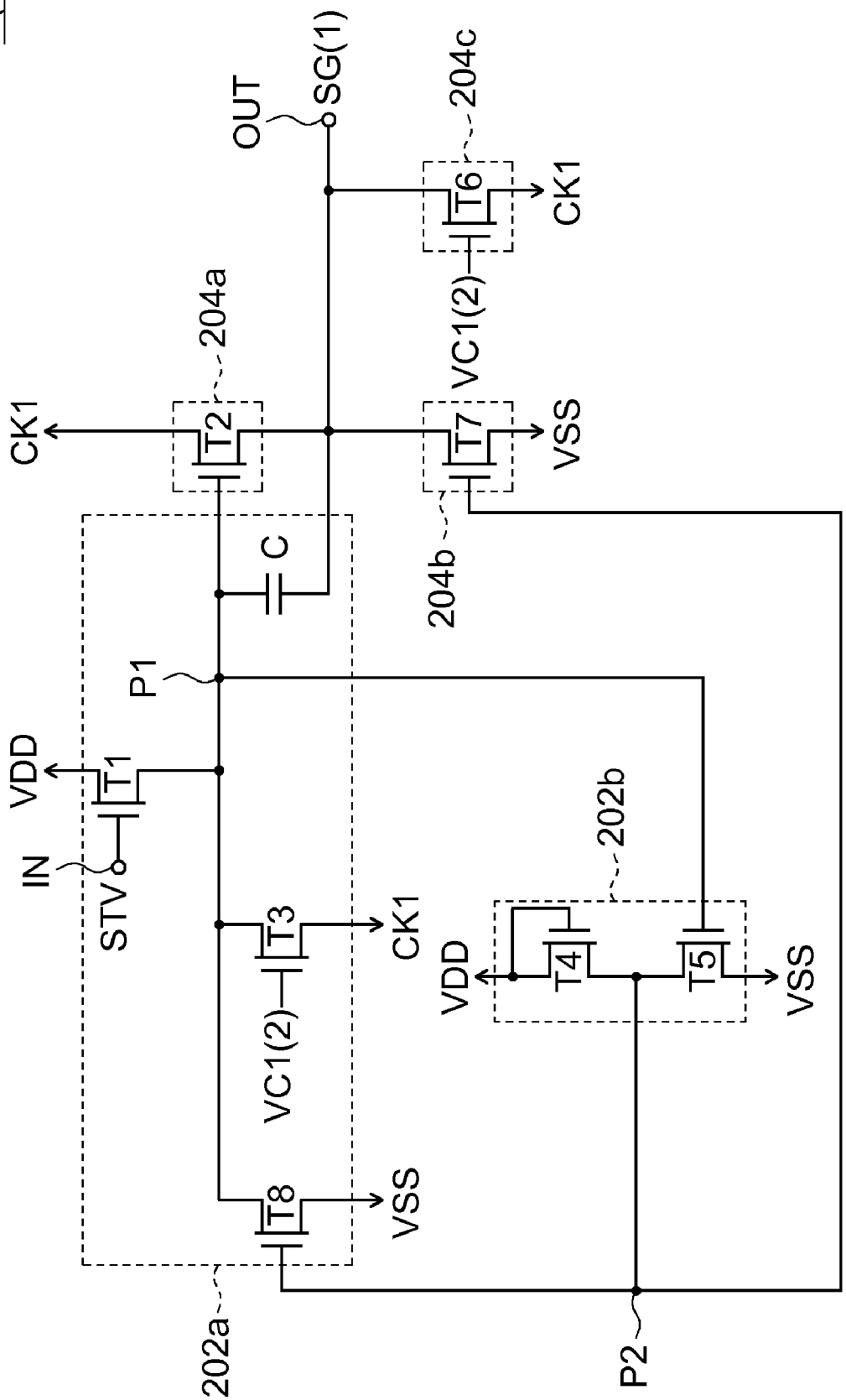
FIG. 2 is a detailed circuit diagram of a stage S(1) of FIG. 1.

The operation of the stage S(1) in response to the clock signal CK1 and the initial signal STV is disclosed below. Referring to FIG. 2, a detailed circuit diagram of a stage S(1) of FIG. 1 is shown. The stage S(1) comprises two driving units 202a and 202b and three level control units 204a, 204b and 204c. The driving unit 202a comprises transistors T1, T3 and T8. The driving unit 202b comprises transistors T4 and T5. The level control units 204a, 204b and 204c respectively comprise transistors T2, T7 and T6. In the present embodiment of the invention, the transistors T1~T8 are all exemplified by an N-type thin film transistor (TFT).

The drain of the transistor T6 is coupled to an output terminal OUT. The gate receives the control signal VC1(2) of the next stage stage S(2). The source receives a control signal C1. The transistor T6 is turned on for providing the control signal C1 to the output terminal OUT in response to the rising edge of the control signal VC1(2).

The drain of the transistor T3 is coupled to the node P1. The gate receives the control signal VC1(2). The source receives the control signal C1. The transistor T3 provides the control signal C1 to the node P1 in response to the rising edge of the control signal VC1(2). In the present embodiment of the invention, the control signal C1 is equal to the clock signal CK1.

The drain of the transistor T1 receives a voltage VDD. The gate is coupled to the input terminal IN to receive an initial signal STV (the gate of T1 receives the input signal SG(1) in stage S(2), receives the input signal SG(3) in stage S(3), and receives the input signal SG(5) in stage S(4) . . . ). The source is coupled to the node P1. The transistor T1 turns the transistor T2 on in response to the rising edge of the initial signal STV so that the scan signal SG(1) is equal to the voltage VDD.

The drain of the transistor T8 is coupled to the node P1. The gate is coupled to a node P2 to receive the control signal VC2(1). The source receives a voltage VSS. The transistor T8 provides the voltage VSS to the node P1 in response to the rising edge of the control signal VC2(1).

The drain of the transistor T2 receives the clock signal CK1. The gate and the source of the transistor T1 together with the drain of the transistor T3 are coupled to the node P1 to receive the control signal VC1(1). The source is coupled to the output terminal OUT. The transistor T2 is turned on to provides a clock signal CK1, which is at high voltage level, to the output terminal OUT.

The drain of the transistor T7 is coupled to the output terminal OUT. The gate is coupled to the source of the transistor T1 and the drain of the transistor T3 via the node P2 to receive the control signal VC2(1). The source receives the voltage VSS. The transistor T7 provides the voltage VSS to the output terminal OUT when the transistor T7 is turned on.

In the transistor T4, the drain and the gate are coupled together to receive the voltage VDD. The source is coupled to the node P2. The source of the transistor T5 receives the voltage VSS. The gate receives the control signal VC1(1). In the present embodiment of the invention, the width/length ratio of the transistor T5 is larger than the width/length ratio of the transistor T4. The transistors T4 and T5 form a bias voltage unit, which controls the control signal VC2(1) at a low level to turn off the transistor T7 in response to the high level of the control signal VC1(1) and controls the control signal VC2(1) at a high level to turn on the transistor T7 in response to the control signal VC1(1).

Figure 3:
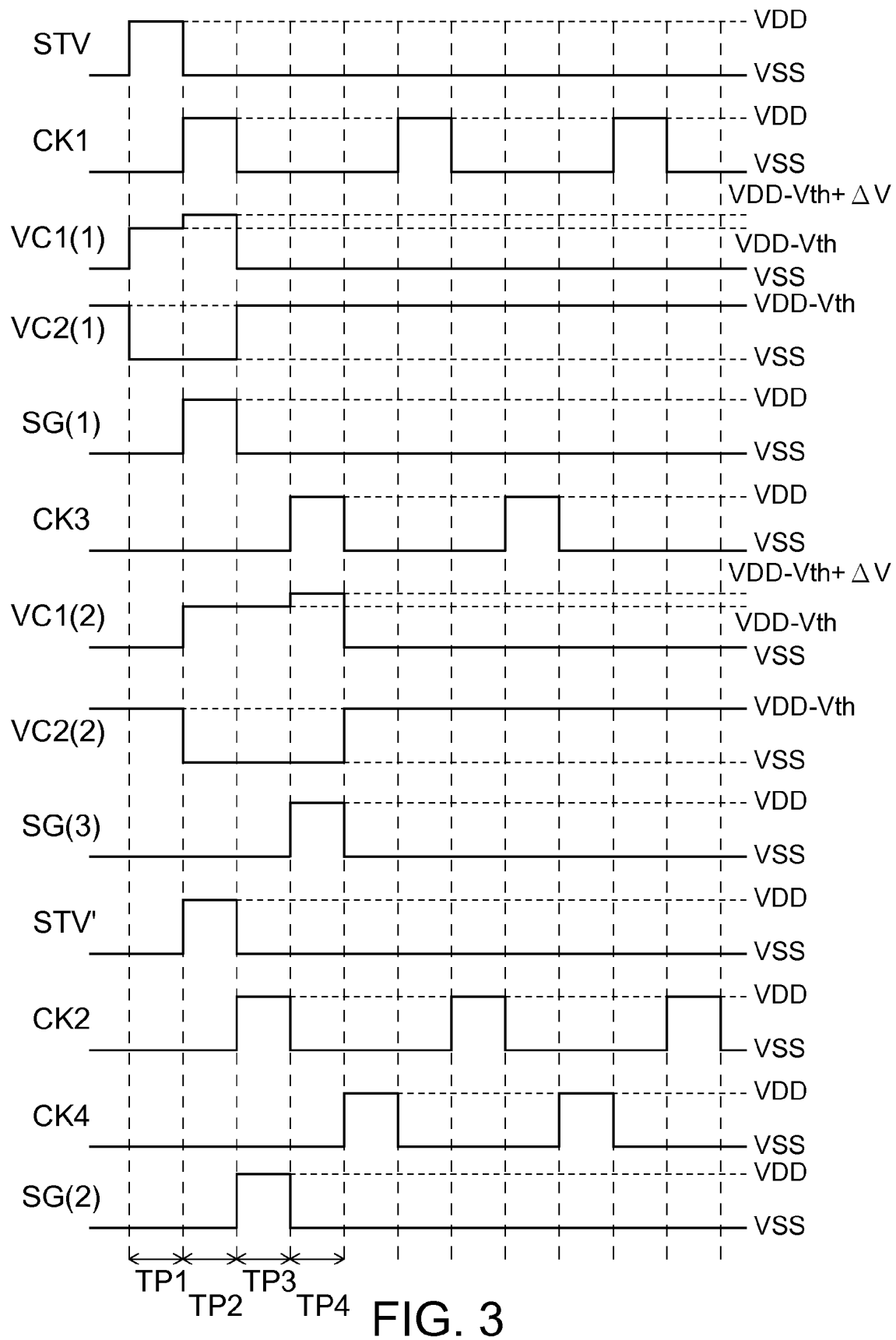
FIG. 3 is a related signal clock diagram of the stage S(1) of FIG. 1.

Referring to FIG. 3, a related signal clock diagram of the stage S(1) of FIG. 1 is shown. During the time period TP1, the initial signal STV is equal to the voltage VDD, and the clock signal CK1 and the control signal VC1(2) are equal to the voltage VSS. The voltage VDD and the voltage VSS respectively are the highest voltage level and the lowest voltage level of the shift register 14a. Meanwhile, the transistor T1 is turned on to make the control signal VC1(1) equal to the high level VDD-Vth1 so that the transistor T2 is turned on and that the scan signal SG(1) is equal to the clock signal CK1, that is, the voltage VSS. The transistors T4 and T5 form an inverter, which makes the control signal VC2(1) equal to the voltage VSS and turns off the transistor T8 and T7 in response to the high level of the control signal VC1(1). The transistors T3 and T6 are turned off when the gate/source voltage is smaller than 0.

During the time period TP2, the transistors T1, T7 and T8 are turned off, and the clock signal CK1 is pulled up from the voltage VSS to the voltage VDD. Meanwhile, due to the boot-strapping effect, the control signal VC1(1) is further pulled up to VC1(1)=VDD-Vth1+ΔV. In the present embodiment of the invention, the voltage difference ΔV is expressed as:

$$\Delta V = \frac{C_{gs}}{C_{p1} + C_{gs}}(VDD - VSS),$$

wherein Cgs is a parasitic capacitor inside the transistor T2, Cp1 is an equivalent capacitor viewed from the node P1, at which the source of the transistor T1 couples to the drain of the transistor T8. The control signal VC1(1) turns on the transistor T2 to make the scan signal SG(1) quickly charged to the voltage VDD.

The scan signal SG(1) is further outputted to the input terminal IN of the stage S(2), so that the control signal VC1(2) of the stage S(2) is pulled up to a high level VDD-Vth1. Meanwhile, the clock signal CK1, that is, the control signal C1, is equal to the voltage VDD, so that both the gate-source voltages of the transistors T3 and T6 are smaller than 0 and both the transistor T3 and T6 are turned off accordingly.

During the time period TP3, the control signal C1 is discharged to the voltage VSS from the voltage VDD. As the level of the control signal VC1(2) is higher than the level of the control signal C1, the transistors T3 and T6 are turned on so that the control signal VC1(1) and the scan signal SG(1) are discharged to the voltage VSS. Meanwhile, the transistor T4 and T5, in response to the low level of the control signal VC1(1), makes the control signal VC2(1) equal to the voltage VDD to turn on the transistor T7 so that the scan signal SG(1) is equal to the voltage VSS.

The operation of the stages S(2)~S(k) differs from that of the stage S(1) in the signal received at the input terminal IN. To be more specific, the scan signals SG(1)~SG(k-1) are pulled up to the voltage VDD two time periods earlier than the corresponding clock signals CK1 and CK3. Thus, the level of the control signals VC1(2)~VC1(k) are maintained at the high level VDD-Vth1 for two time periods and then are pulled up to the high level VDD-Vth1+ΔV For example, during the time periods TP2 and TP3, the control signal VC1(2) of the stage S(2) is equal to the level VDD-Vth1; during the time period TP4, the clock signal CK3 is pulled up to the voltage VDD from the voltage VSS, so that the control signal VC1(2) is pulled up to the high level VDD-Vth1+ΔV.

Thus, the stage S(1) of the present embodiment of the invention provides the scan signal SG(1) in response to the clock signal CK and the initial signal STV and so does the subsequent stage S(2) provide the scan signal SG(3) in response to the clock signal CK3 and the scan signal SG(1). Despite the present embodiment of the invention is exemplified by the operation of the stages S(1) and S(2), the operation of the remaining stages S(3)~S(k) of the shift register 14a can also be obtained according to the operation of the stages S(1) and S(2).

The operation of the stages S'(1)~S'(k) of the shift register 14b differs with the operation of the stage S(1)~S(k) in the wave pattern of the received initial signal STV' and that the clock signals CK2 and CK4 are one time period later than the initial signal STV and the clock signals CK1 and CK3 respectively. Thus, the stages S'(1)~S'(k) can execute the operation similar to that of the stages S(1)~S(k) to produce the scan signals SG(2), SG(4), . . . , SG(n).

The shift register of the present embodiment of the invention produces the control signals VC1(1)~VC1(k) through the circuit of the stages to control the operation of the previous stage by the control signals VC1(1)~VC1(k) rather than by the corresponding scan signal. Thus, the shift register of the present embodiment of the invention has the advantage of shorter delay in the scan signal.

Besides, each stages of the shift register 14a and 14b of the present embodiment of the invention has two control units 204b and 204c respectively having a transistor T7 and a transistor T6 for pulling down the level of the scan signal. When the operation of one of the transistors T6 and T7 gradually becomes abnormal due to stress effect after the transistor is turned on for a long time, each stages of the present embodiment of the invention can pull down the scan signal to the lowest voltage level through the assistance of another transistor. Thus, each stage of the present embodiment of the invention prevents the scan signal from having erroneous level when the level control unit operates abnormally, hence having a longer lifespan.

Second Embodiment

Figure 4:
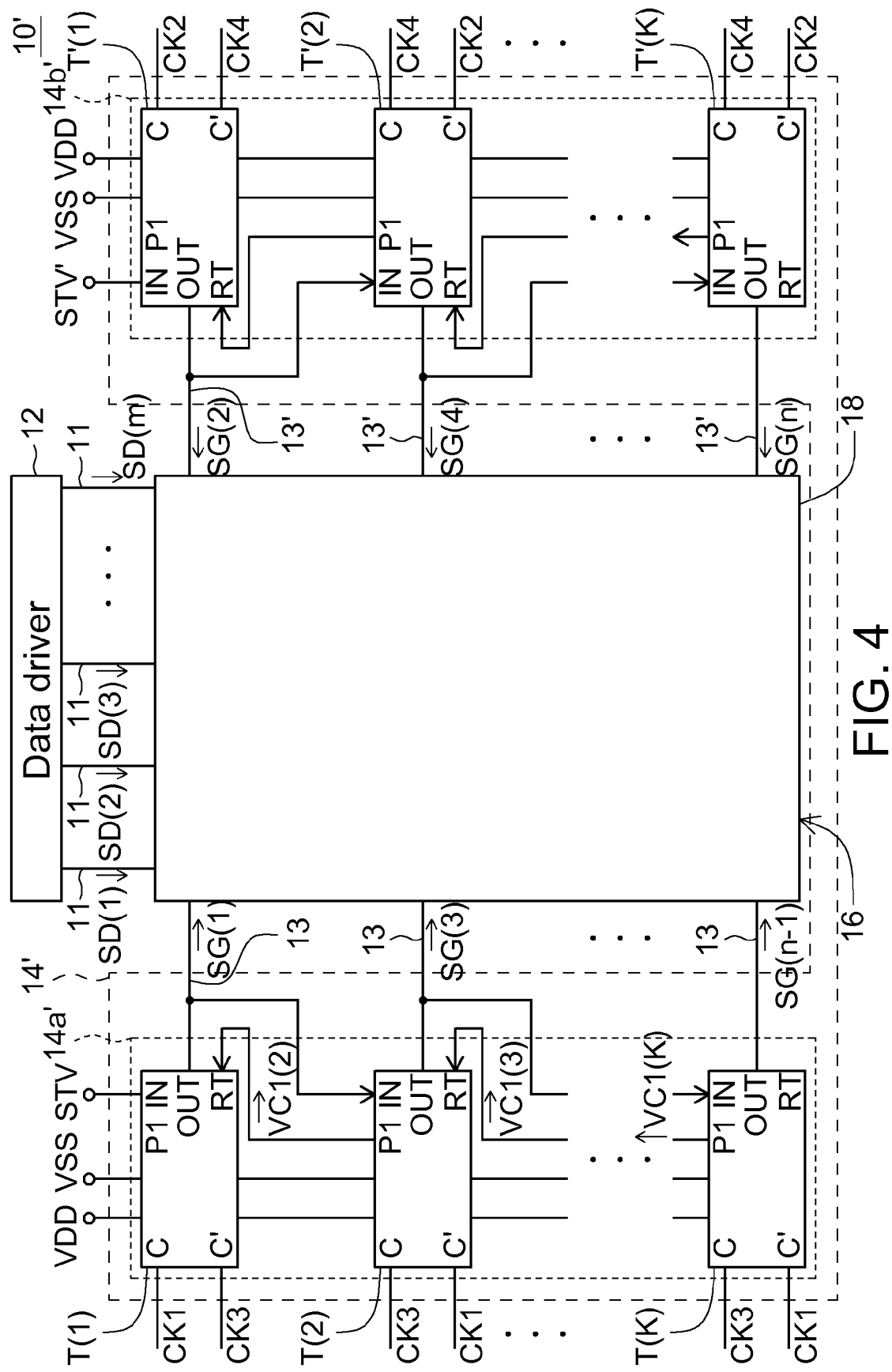
FIG. 4 is a block diagram of an LCD of a shift register according to a second embodiment of the invention.

Referring to FIG. 4, a block diagram of an LCD of a shift register according to a second embodiment of the invention is shown. On the part of the shift registers 14a' and 14b' of the present embodiment of the invention, the stages T(1)~T(k) and T'(1)~T'(k) differ with the stages S(1)~S(k) and S'(1)~S'(k) of the first embodiment in that each stages has two clock terminals C and C' to receive two of the clock signals CK1~CK4 to produce the corresponding scan signals SG(1)~SG(n). The following disclosure is exemplified by the stage T(1), and the operation of the stages T(1)~T(k) and T'(1)~T'(k) of the present embodiment of the invention can be obtained according to the operation of the stage T(1).

Figure 5:
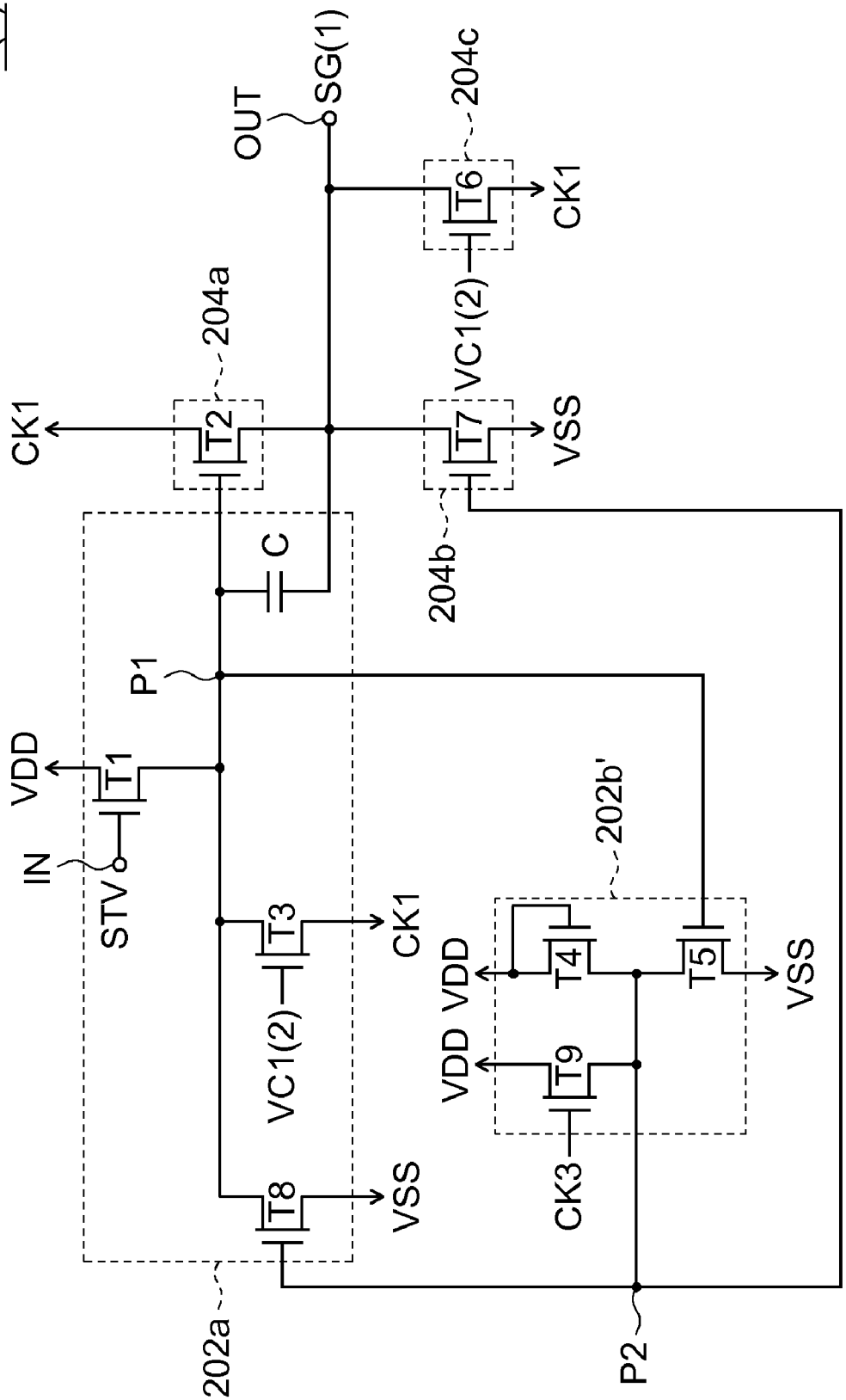
FIG. 5 is a detailed circuit diagram of a stage T(1) of FIG. 4.

Referring to FIG. 5, a detailed circuit diagram of a stage T(1) of FIG. 4 is shown. The stage T(1) differs with the stage S(1) of the first embodiment in that the stage T(1) further comprises a transistor T9. The drain of the transistor T9 receives a voltage VDD, the gate receives a clock signal CK3, and the source is coupled to a node P2. The transistor T9 provides the voltage VDD to the node P2 in response to the high level of the clock signal CK3 to make the control signal VC2(1) at the node P2 equal to the voltage VDD. The width/length ratio of the transistor T9 is smaller than that of the transistor T5. Thus, when both the transistor T5 and T9 are turned on, the control signal VC2(1) is pulled down to the voltage VSS by the transistor T5.

During the time periods TP1~TP3, the clock signal CK3 is equal to the voltage VSS, and the transistor T9 is turned off. During the time period TP4, the clock signal CK3 is equal to the voltage VDD. Meanwhile, the transistor T9 is turned on and the transistor T5 is turned off to make the control signal VC2(1) equal to the voltage VDD-Vth.

The stages T(1)~T(k) and T'(1)~T'(k) of the present embodiment of the invention differs with the corresponding stages of the first embodiment in that the level control unit 202b' has a transistor T9 for making the level of the voltage signal VC2(n) equal to VDD-Vth during the time period TP4. Thus, the stage of the present embodiment of the invention has the advantages of being applicable to double-sided scan driver and having lower load but longer lifespan.

Figure 6:
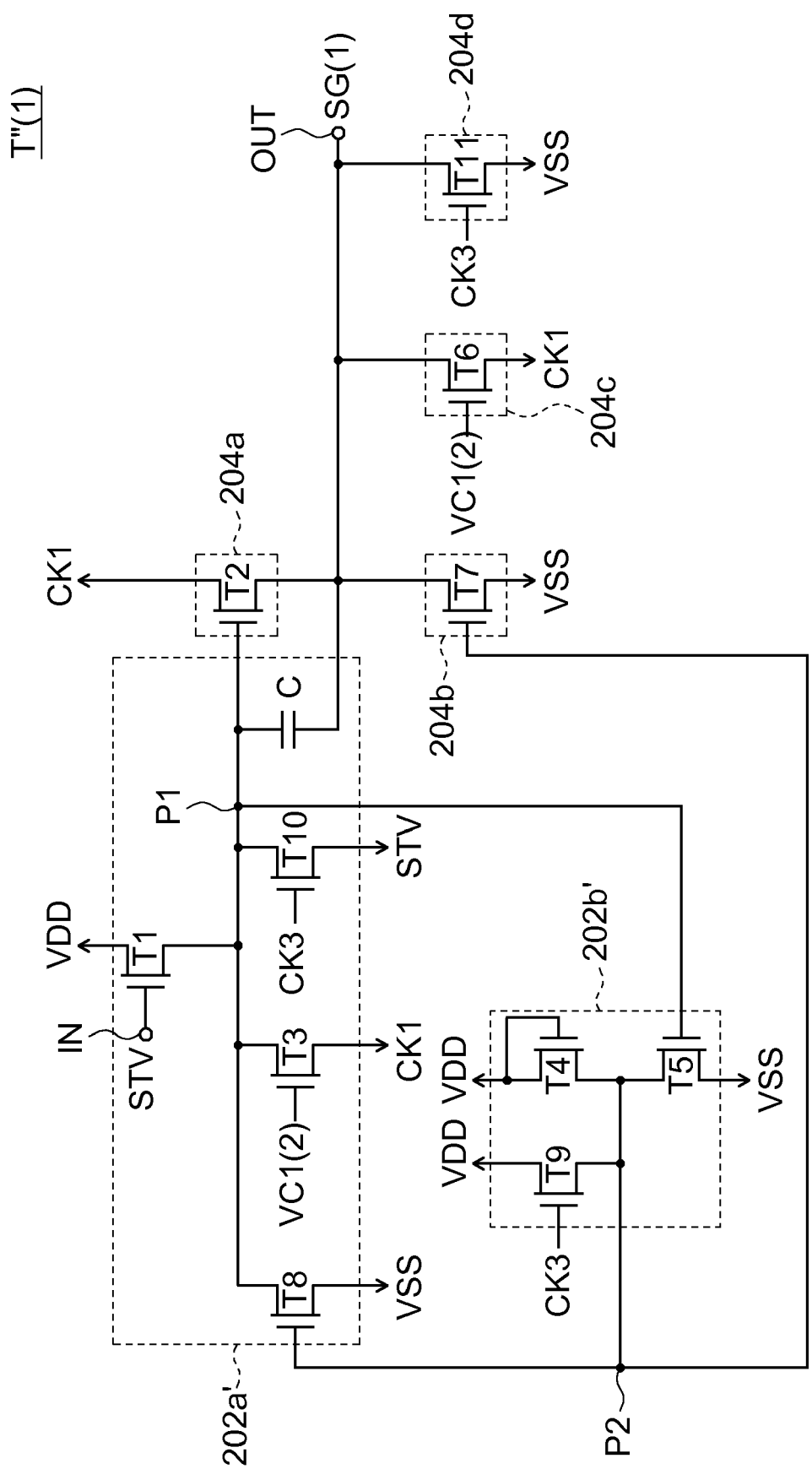
FIG. 6 is another detailed circuit diagram of the stage T(1) of FIG. 4.

In the present embodiment of the invention, the stages T(1)~T(k) and T'(1)~T'(k) all have the circuit structure of FIG. 5 to embody the shift register 10'. However, the structures of the stages T(1)~T(k) and T'(1)~T'(k) of the present embodiment of the invention are not limited to the above circuit structure. For example, the stages T(1)~T(k) and T'(1)~T'(k) can have a circuit structure as shown in FIG. 6. FIG. 6 shows another detailed circuit diagram of the stage T(1) of FIG. 4. The stage T"(1) differs with the stage T(1) in that the stage T"(1) further comprises a level control unit 204d comprising a transistor T11 and that the driving unit 202a' further comprises a transistor T10.

The drain of the transistor T10 is coupled to the node P1. The gate receives the clock signal CK3. The source receives the initial signal STV. The transistor T8 turns on to provide the initial signal STV to the node P1 in response to a high level of the clock signal CK3. The drain of the transistor T11 is coupled to the output terminal OUT. The gate receives the clock signal CK3. The source receives the voltage VSS. The transistor T11, in response to a high level of clock signal CK3, provides the voltage VSS to the output terminal OUT to make the scan signal SG(1) equal to the voltage VSS.

During the time periods TP1~TP3, the clock signal CK3 is equal to the low level VSS; meanwhile, the transistors T10 and T11 are all turned off. During the time period TP4, the clock signal CK3 is equal to the high level VDD; meanwhile, the transistors T10 and T11 are turned on and respectively provides the initial signals STV and voltage VSS to the node P1 and the output terminal OUT During the time period TP4, the initial signal STV is equal to the voltage VSS. Thus, the stages T"(1)~T"(k) of the present embodiment of the invention also have the advantages of being applicable to double-sided scan driver and having lower load but longer lifespan.

Third Embodiment

Figure 7:
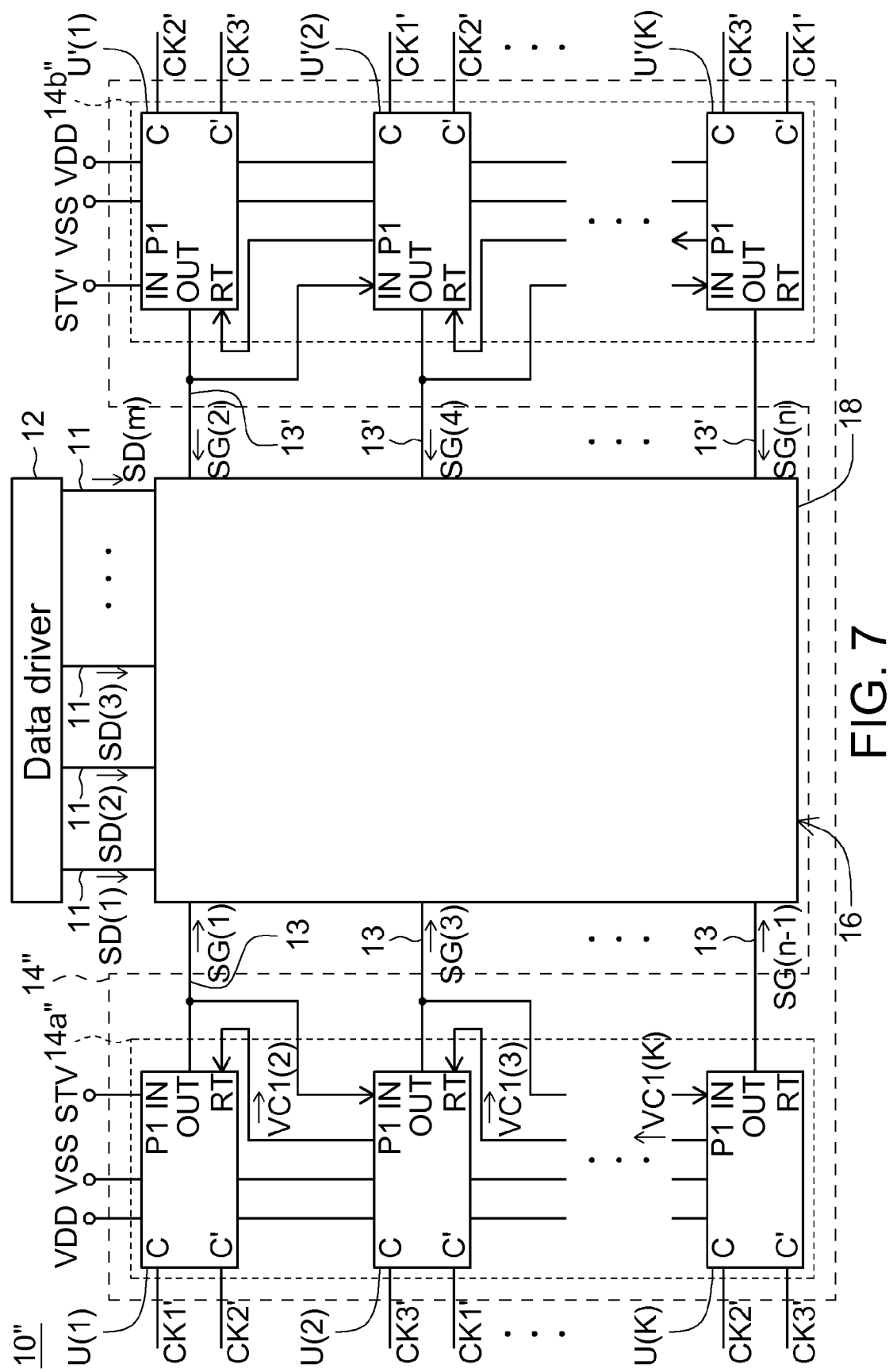
FIG. 7 is a block diagram of an LCD of a shift register according to a third embodiment of the invention.
Figure 8:
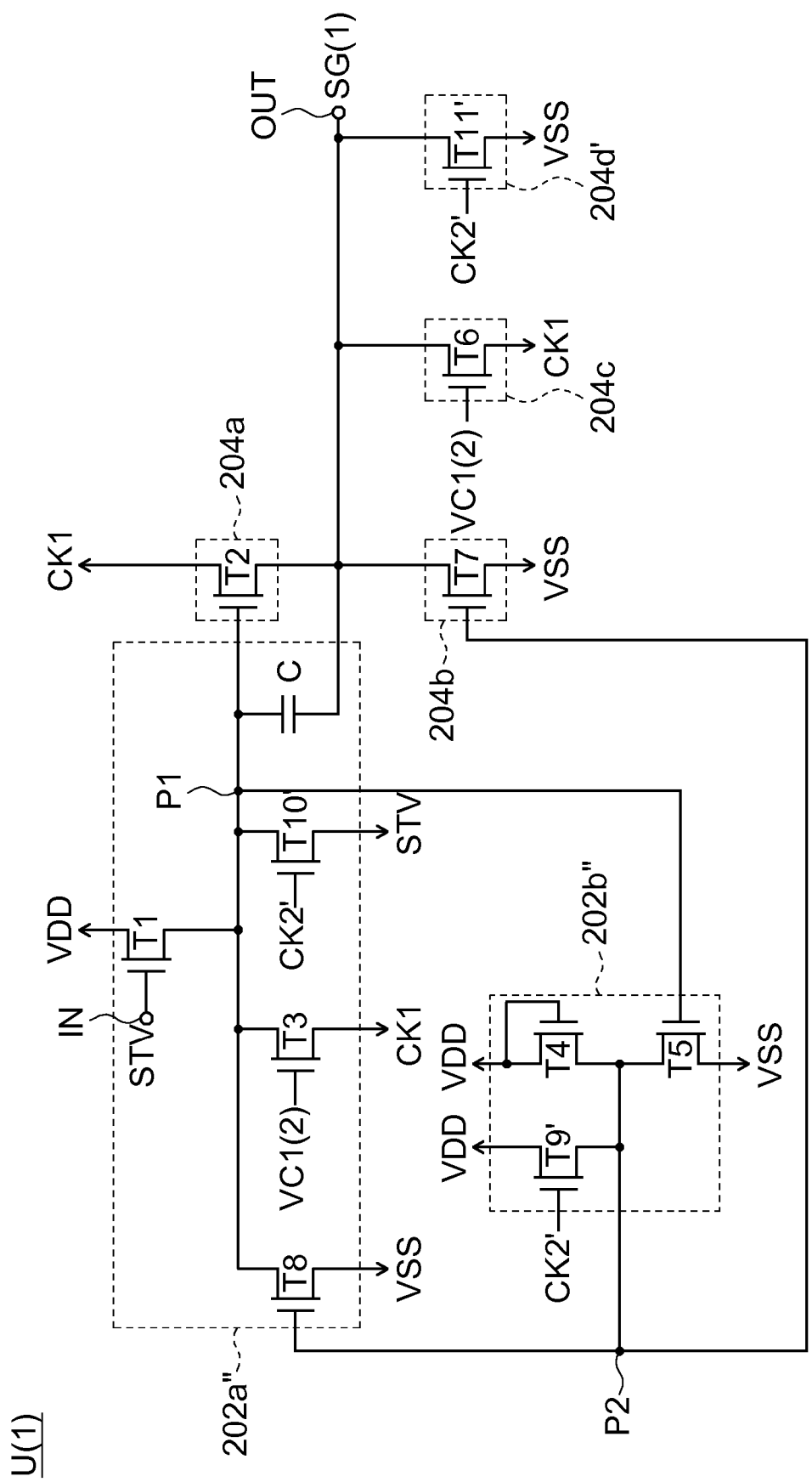
FIG. 8 is a detailed circuit diagram of a stage U(1) of FIG. 7.

Referring to FIG. 7 and FIG. 8. FIG. 7 is a block diagram of an LCD of a shift register according to a third embodiment of the invention. FIG. 8 is a detailed circuit diagram of a stage U(1) shown in FIG. 7. The LCD 10" of the present embodiment of the invention differs with the LCD 10' of the second embodiment in that the shift register 14" employs three clock signals CK1', CK2' and CK3' and that the transistors T9, T10 and T11 of the stage T"(1) are respectively replaced by the transistors T9', T10' and T11' of the stage U(1). The transistors T9', T10' and T11' differ with the corresponding transistors T9 and T10 and T11 in that the gate of each of the transistors T9', T10' and T11' receives a clock signal CK2'.

Figure 9:
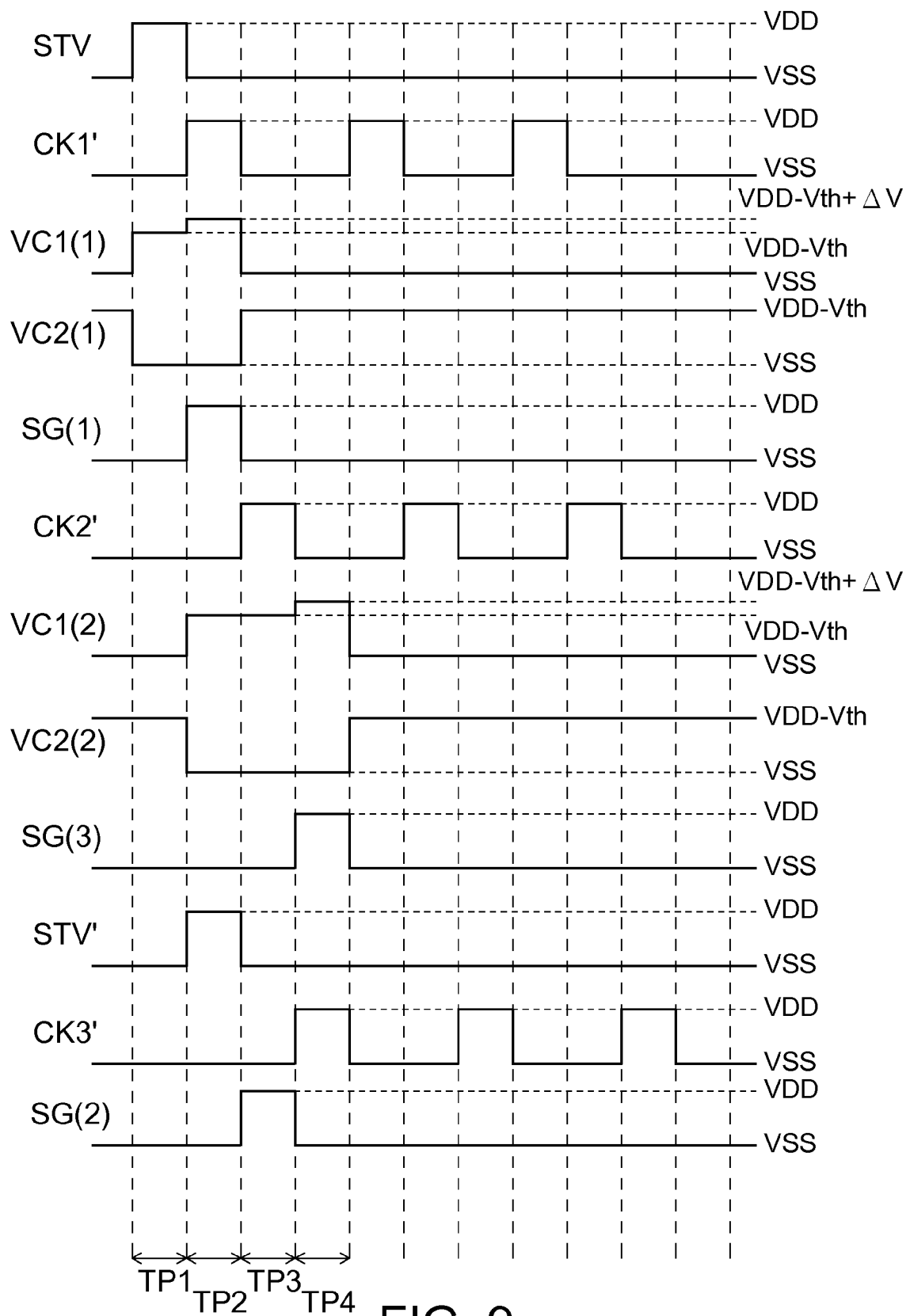
FIG. 9 is a related signal clock diagram of the stage U(1) of FIG. 7.

Referring to FIG. 9, a related signal clock diagram of the stage U(1) of FIG. 7 is shown. The stage U(1) of the present embodiment of the invention differs and the stages S(1), T(1)

and T"(1) of the first and the second embodiment are the same in having a similar clock wave pattern but are different in that the clock signal CK2' is pulled up to a high level one time period earlier than the clock signal CK3. Thus, during the time period TP3, the transistors T9', T10' and T11' can effectively make the control signal VC2(1) equal to the voltage VDD, make the control signal VC1(1) equal to the voltage VSS, and make the scan signal SG(1) equal to the voltage VSS. Thus, the stages U(1)~U(k) and U'(1)~U'(k) of the present embodiment of the invention also have the advantages of being applicable to double-sided scan driver and having lower load but longer lifespan.

Fourth Embodiment

Figure 10:
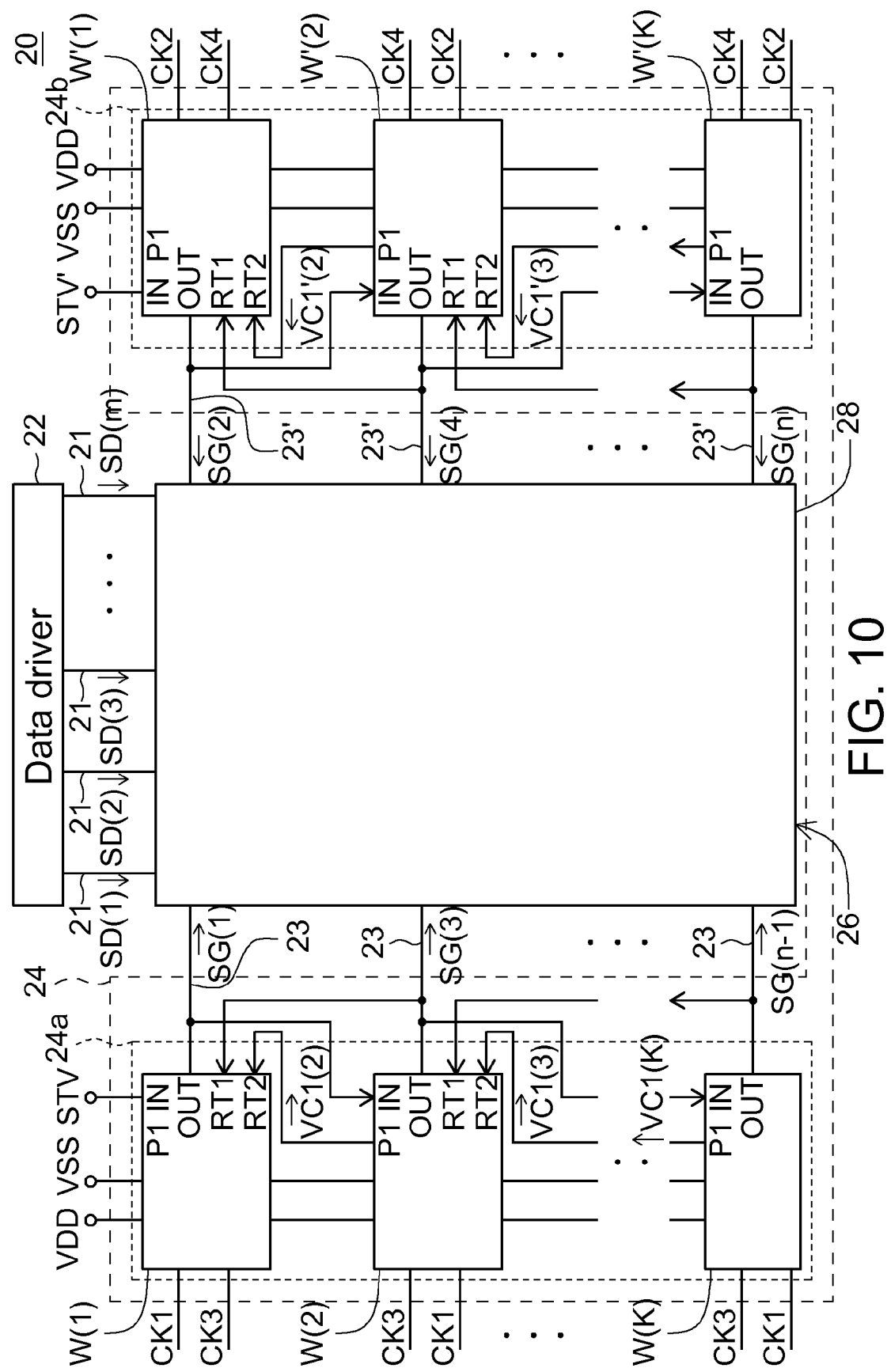
FIG. 10 is a block diagram of an LCD of a shift register according to a fourth embodiment of the invention.

Referring to FIG. 10, a block diagram of an LCD of a shift register according to a fourth embodiment of the invention is shown. The LCD 20 of the present embodiment of the invention is different from the LCD 10 of the first embodiment in that each of the stages W(1)-W(k) and W'(1)-W'(k) has two control terminals RT1 and RT2. The control terminal RT2, as substantially the same as the control terminal RT in FIG. 1, receives control signal VC1 of the succession stage. The control terminal RT1 receives the scan signal SG of the succession stage. From the perspective of the stages W(1)-W(k), W(2) is the next stage of the W(1) and outputs scan signal SG(3), W(3) is the next stage of W(2) and outputs scan signal SG(5). On the other hand, W'(2) is the next stage of the W'(1) and outputs scan signal SG(2), W'(3) is the next stage of W'(2) and outputs scan signal SG(4) from the perspective of the stages W'(1)-W'(k). In other words, odd-number stages W(1)-W(k) provide scan signals SG(1), SG(3), SG(5) . . . and even-number stages W'(1)-W'(k) provide scan signals SG(2), SG(4), SG(6) . . . for LCD panel 26.

Figure 11:
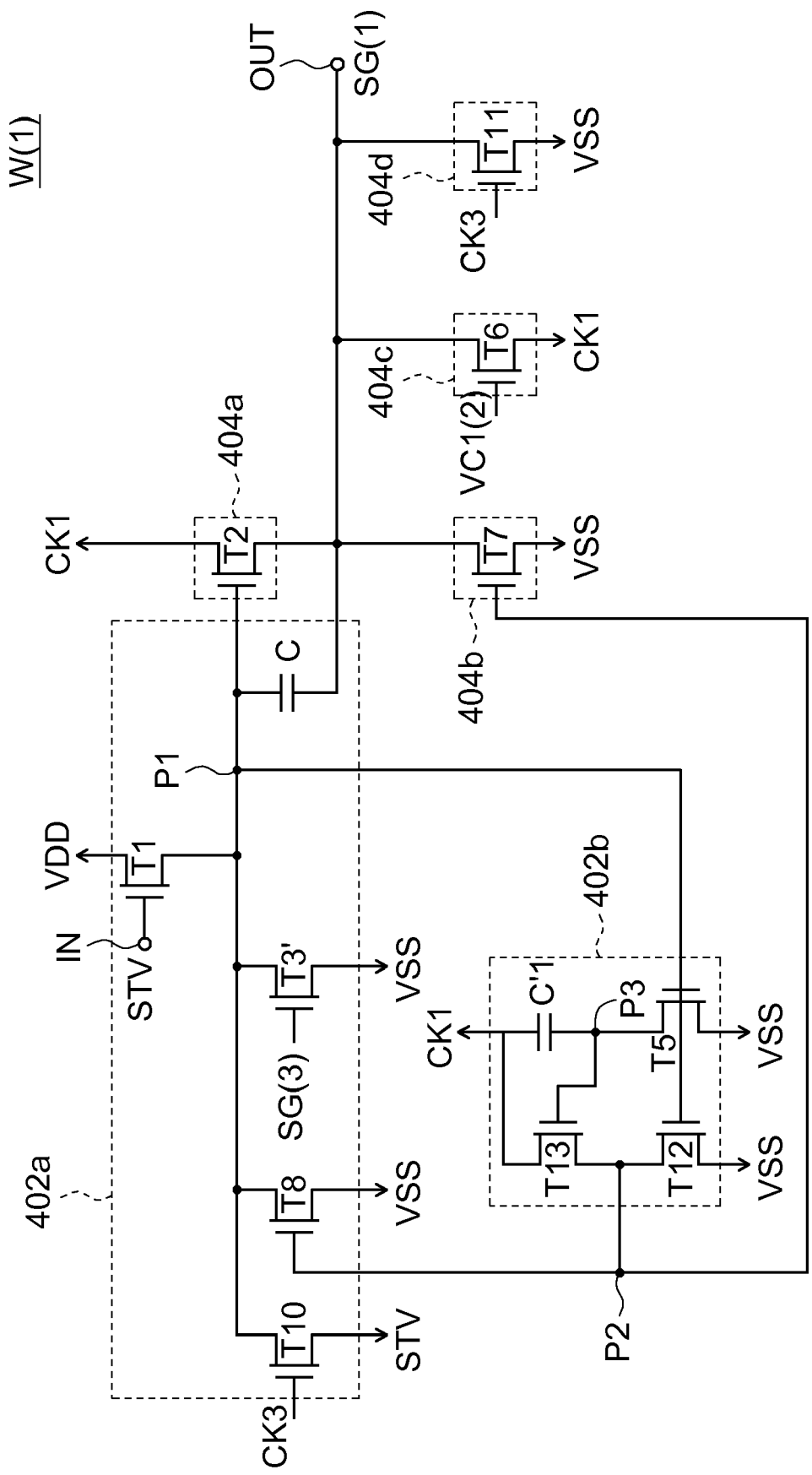
FIG. 11 is a detailed circuit diagram of a stage W(1) shown in FIG. 10.

Referring to FIG. 11, a detailed circuit diagram of a stage W(1) shown in FIG. 10 is shown. Instead of including the transistor T3, the driving unit 402a includes a transistor T3'. The gate receives the scan signal SG(3) from next stage W(2). The source receives the voltage VSS. The driving unit 402a further includes a transistor T10. The gate receives the clock signal CK3. The source receives the initial signal STV (the source receives the input signal SG(1) in stage W(2), receives the input signal SG(3) in stage W(3), and receives the input signal SG(5) in stage W(4) . . . ). The drain is coupled to the node P1. Likewise, the transistor T3' in stage W(2) receives the scan signal SG(5) from next stage W(3) to turn on or turn off the level control unit 404a.

Instead of including the transistor T4 and T5, the driving unit 402b includes transistors T5, T12, T13 and a capacitor C'. Besides the level control units 404a, 404b, and 404c, which have substantially the same circuit structures as the level control units 204a, 204b, and 204c, the stage W(1) further comprises level controller 404d, which includes a transistor T11. The gate receives the clock signal CK3. The source receives the voltage VSS. The drain is coupled to the output terminal OUT.

Figure 12:
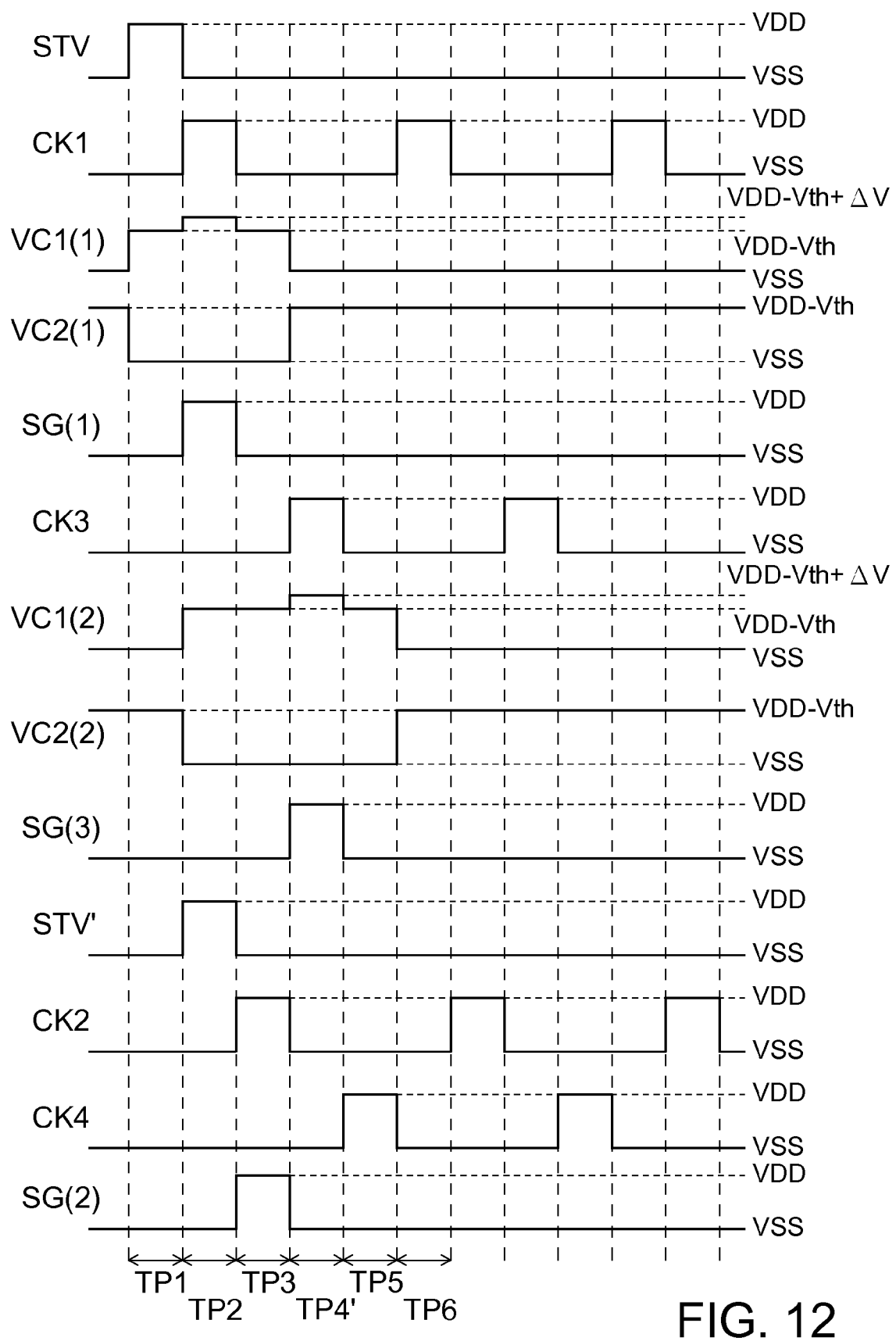
FIG. 12 is a related signal clock diagram of the stage W(1) of FIG. 11.

Referring to FIG. 12, a related signal clock diagram of the stage W(1) of FIG. 11 is shown. Since the transistor T3 is replaced by the transistor T3' in the present embodiment, the voltage level of the control signal VC1(1) is pulled down from the voltage VDD-Vth to the voltage VSS in the time period TP4'. Similarly, the transistor T10 is also enabled in the time period TP4' for pulling down the control signal VC1(1) from the voltage VDD-Vth to the voltage VSS.

The transistors T5, T12, T13, and the capacitor C' forms a voltage regulator for lifting the voltage level of the control signal VC2(1) at node P2 to the voltage VDD-Vth when the driving unit 402a provide the voltage VSS from the node P1 to the driving unit 402b at the beginning of a time period TP'4.

The transistor T11 is enabled at the beginning of the time period TP4' for pulling down the scan signal SG(1) from the voltage VDD to the voltage VSS. Thus, the stages W(1)~W(k) and W'(1)~W'(k) of the present embodiment of the invention also have the advantages of being applicable to double-sided scan driver and having lower load but longer lifespan.

Figure 13:
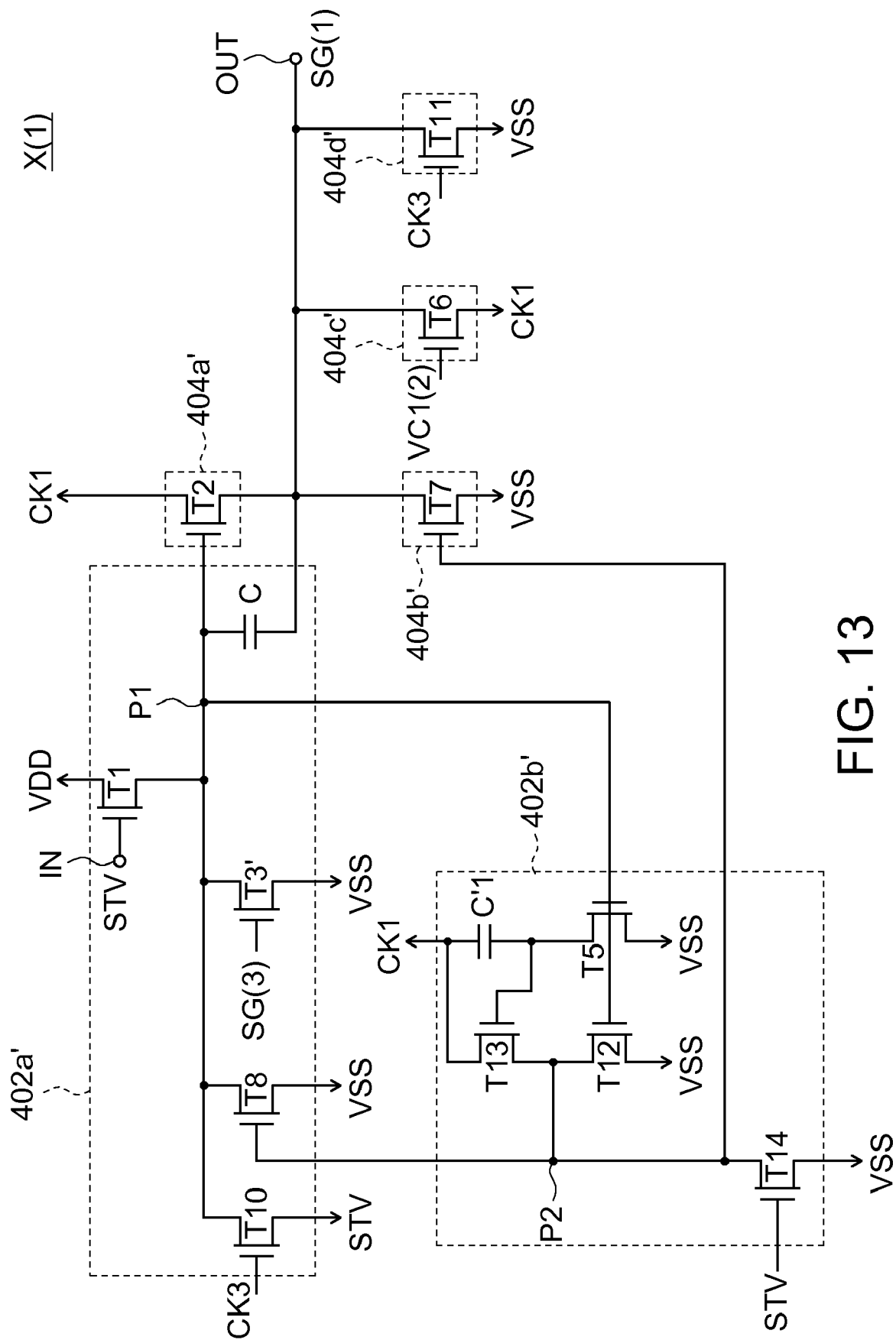
FIG. 13 is another detailed circuit diagram of a stage W(1) shown in FIG. 10.

Referring to FIG. 13, another detailed circuit diagram of a stage W(1) shown in FIG. 10 is shown. The stage X(1) is different from the stage W(1) shown in FIG. 11 in that the driving unit 402b' further includes transistor T14. The gate receives the input signal STV (the gate receives the input signal SG(1) in stage W(2), receives the input signal SG(3) in stage W(3), and receives the input signal SG(5) in stage W(4) . . . ). The source receives the voltage VSS. The drain is coupled to the node P2. Referring to FIG. 12, it can be obtained that the transistor T14 is turned on for pulling the control signal VC2(1) down to the voltage VSS in the time period TP1.

Figure 14:
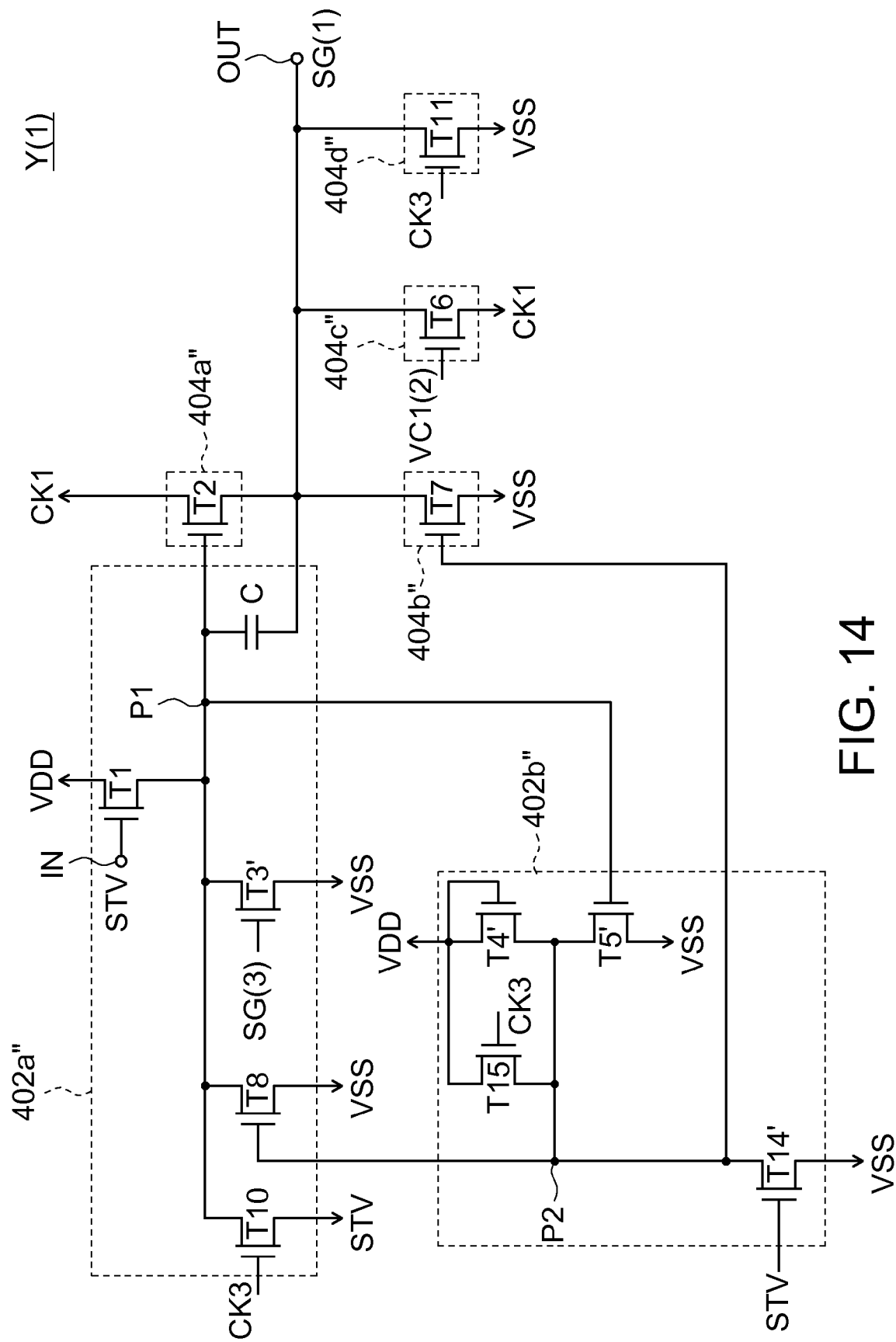
FIG. 14 is another detailed circuit diagram of a stage W(1) shown in FIG. 10.

Referring to FIG. 14, another detailed circuit diagram of a stage W(1) shown in FIG. 10 is shown. The stage Y(1) is different from the stage W(1) in that the driving unit 402b is replaced by a driving unit 402b', which includes transistors T4', T5', T14', and T15. The operations and circuit connections of the transistors T4' and T5' are substantially the same as that of the transistor T4 and T5 shown in FIG. 2 for inverting the control signal VC1(1) to accordingly obtain the control signal VC2(1). The operation of the transistor T14' is substantially the same as the transistor T14 for pulling the control signal VC2(1) down to the voltage VSS in the time period TP1.

Referring to FIG. 12, it can be obtained that the transistor T15 is turned on for pulling the control signal VC2(1) up to the voltage VDD in the time period TP4'. In the present embodiment of the invention, the width/length ratio of the transistor T5' is larger than the width/length ratio of the transistor T15. Thus, even the transistor T15 is turned on in the time period TP4', the level of the control signal VC2(1) is kept to be the voltage VSS since the transistor T5' is turned on. Thus, the stage W(1)-W(K) and W'(1)-W'(k) shown in FIG. 10 can also be implemented with the stages X(1) and Y(1) respectively shown in FIG. 13 and FIG. 14.

Figure 15:
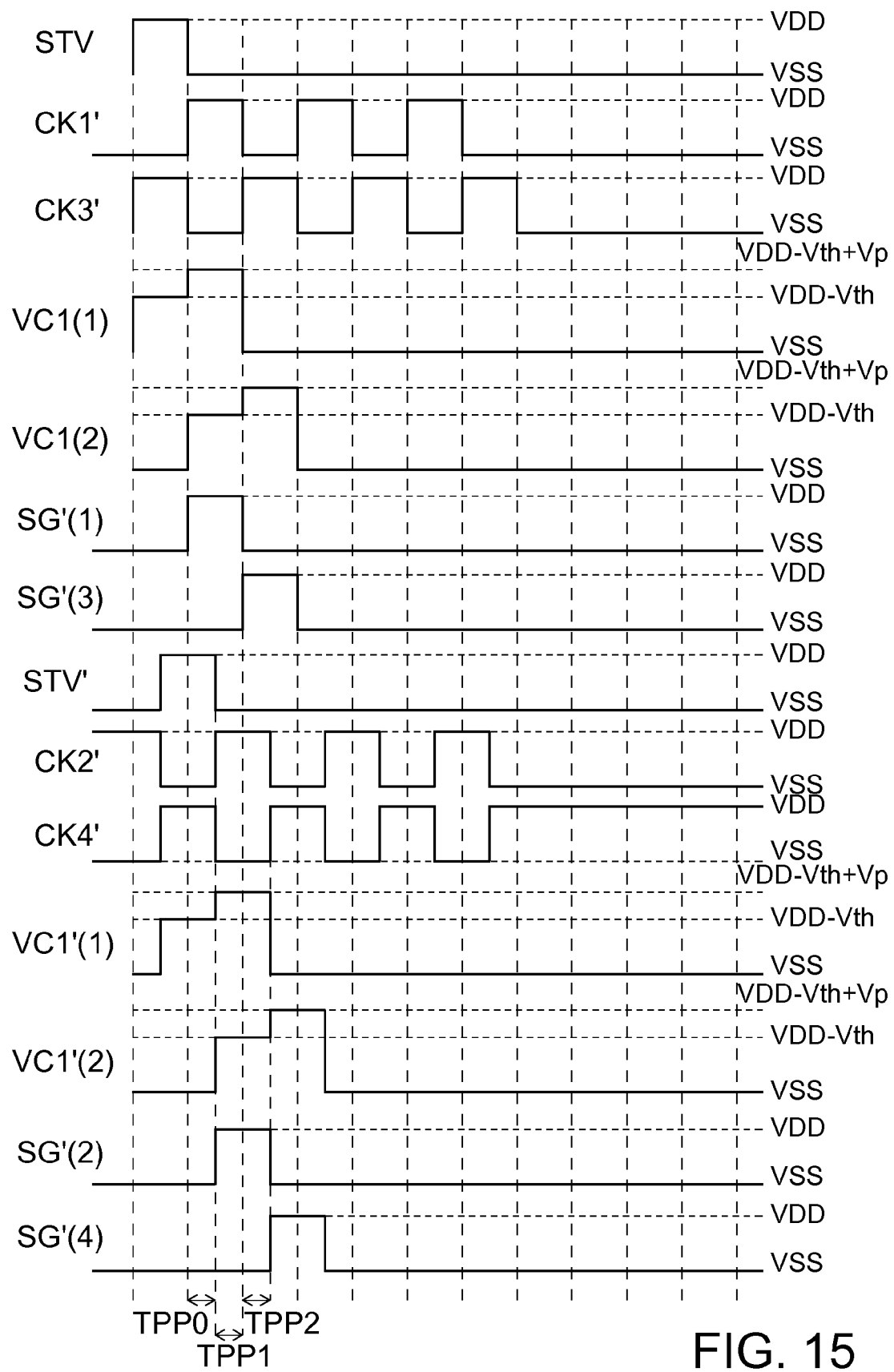
FIG. 15 a related signal clock diagram of the stage W(1) of FIG. 12

Though only the example that the stage W(1) works with signals shown in the clock diagram in FIG. 12 is illustrated as an example in the present embodiment of the invention, the stage W(1) is not limited thereto. In other example, as shown in FIG. 15, clock signals CK1' and CK3' with doubled duty cycles are applied in the stage W(1). Thus, the duty cycles of each of the scan signals SG'(1) to SG'(n) are also doubled and the enabled time for each of the scan signals SG'(1) to SG'(n) is partially overlapped with that of the succession scan signal.

For example, the scan signal SG'(2) is enabled in time periods TPP1 and TPP2 for enabling a corresponding row (ex: $2^{nd}$ row) in the pixel array 28 and the scan signal SG'(1) is enabled in time periods TPP0 and TPP1 for enabling a corresponding row (ex: $1^{st}$ row) in the pixel array 28.

In the time period TPP1, data signals SD(1) to SD(m) corresponding to the $1^{st}$ row are provided via the data driver 22. Thus, the enabled m pixels on the $1^{st}$ row are charged by the respective data signals SD(1) to SD(m) corresponding to the $1^{st}$ row for display the corresponding image in the time period TPP1. Meanwhile, the m pixels on the $2^{nd}$ row are also enabled in the time period TTP1. Thus, the enabled m pixels on the $2^{nd}$ row are precharged by the respective data signals SD(1) to SD(m) corresponding to the $1^{st}$ row in the time period TPP1.

In the time period TPP2, data signals SD(1) to SD(m) corresponding to the $2^{nd}$ row are provided via the data driver 22. Thus, the enabled m pixels on the $2^{nd}$ row are charged by the respective data signals SD(1) to SD(m) corresponding to the $2^{nd}$ row for display the corresponding image in the time period TPP2. Similarly, the m pixels on the $3^{rd}$ row are also enabled and precharged by the respective data signals SD(1) to SD(m) corresponding to the $2^{nd}$ row in the time period TPP2.

In other words, the pixel data signals corresponding to the present selected pixel row are used to precharge the succession pixel row. Thus, the reaction time of the LCD panel 26 can also be effectively reduced.

In the embodiments of the invention as shown in FIG. 1~FIG. 15, the control signal CK1 and CK3 interchange between adjacent stages. For example, referring to FIG. 10 and FIG. 11, control signal (clock signal) CK1 is inputted to transistor T2, T6 and CK3 is inputted to transistor T10, T11 in stage W(1). However, control signal (clock signal) CK1 is inputted to transistor T10, T11 and CK3 is inputted to transistor T2, T6 in stage W(2). Likewise, control signal (clock signal) CK2 is inputted to transistor T2, T6 and CK4 is inputted to transistor T10, T11 in stage W'(1). Control signal (clock signal) CK1 is inputted to transistor T10, T11 and CK3 is inputted to transistor T2, T6 in stage W'(2). In FIG. 1~FIG. 13, each of the clock signals CK1~CL4 or CK'1·CK'4 is at high level voltage during a quarter period and is at low level voltage during three quarter period. As a result, the clock signal CK3 (CK'3) is delayed by a two quarter period with respect to the clock signal CK1(CK'1). The clock signal CK4 (CK'4) is delayed by a two quarter period with respect to the clock signal CK2(CK'2). In FIG. 14~FIG. 15, the clock signal CK'3 is in opposite phase with respect to the clock signal CK'1, and clock signal CK'4 is in opposite phase with respect to the clock signal CK'2.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A shift register having a plurality of stages provided on two sides of a display panel for providing scan signals, wherein each stage of the shift register on one side of the display panel comprises:
    a first level control unit for providing a first clock signal to an output terminal;
    a first driving unit coupled to an input terminal of the first level control unit via a first node for providing a first control signal, wherein the first driving unit turns on the first level control unit in response to a front edge of an input signal and turns off the first level control unit when an output signal of the next stage is higher than the level of a first voltage that is input to the first level control unit;
    a second level control unit for providing the first voltage to the output terminal;
    a second driving unit for turning off the second level control unit in response to the front edge of the first control signal and turning on the second level control unit in response to the rear edge of the first control signal; and
    a third level control unit for providing the first clock signal to the output terminal when the level of the first control signal of the next stage is higher than the level of the first clock signal that is input to the third level control unit, wherein:
    when both the signal at the output terminal and the first control signal are at high levels, the first clock signal is also at a high level.

2. The shift register according to claim 1, wherein the first driving unit comprises:
    a first transistor, wherein the gate receives the output signal of the next stage, the first source/drain receives the first voltage, the second source/drain is coupled to the first node.

3. The shift register according to claim 1, wherein:
    the first driving unit comprises a first transistor, wherein the gate receives a second clock signal, the first source/drain receives the input signal, the second source/drain is coupled to the first node; and
    the enabling time of the second clock signal and the enabling time of the first clock signal are non-overlapped, and the second clock signal is delayed by a two quarter period with respect to the first clock signal.

4. The shift register according to claim 1, wherein the second driving unit comprises:
    a second node and a third node;
    a first transistor and a second transistor, wherein the gates are coupled to the first node, the first sources/drains receiving the first voltage, and the second sources/drains are respectively coupled to the second and the third node;
    a fifth transistor, wherein the gate is coupled to the third node, first source/drain receives the first clock signal, and the second source/drain is coupled to the second node; and
    a capacitor, first and second terminals respectively receiving the first clock signal and coupled to the third node.

5. The shift register according to claim 4, further comprising:
    a fourth transistor, wherein the gate receives the input signal, the first source/drain receives the first voltage, and second source/drain is coupled to the second node.

6. The shift register according to claim 1, wherein the second driving unit comprising:
    a bias voltage unit coupled to the input terminal of the second level control unit via a second node, the voltage on the second node is a second control signal, wherein the bias voltage unit pulls down the level of the second control signal to turn off the second level control unit in response to the front edge of the first control signal and pulls up the level of the second control signal to turn on the second level control unit in response to the rear edge of the first control signal.

7. The shift register according to claim 6, wherein the second driving unit further comprises:
    a first transistor, wherein the gate receives a second clock signal, the first source/drain receives a second voltage, and the second source/drain is coupled to the second node; and
    an second transistor, wherein the gate receives the input signal, the first source/drain receives the first voltage, and the second source/drain is coupled to the second node.

8. The shift register according to claim 1, wherein the second level control unit comprises:
    a first transistor, wherein the gate receives a second control signal, the first source/drain is coupled to the output terminal, and the second source/drain receives the first voltage.

9. The shift register according to claim 1, wherein the third level control unit comprises:

a first transistor, wherein the gate receives the first control signal of the next stage, the first source/drain is coupled to the output terminal, and the second source/drain receives the first clock signal.

10. The shift register according to claim 1, wherein:

the first driving unit comprises a first transistor, wherein the gate receives a second clock signal, the first source/drain receives the input signal, the second source/drain is coupled to the first node; and the enabling time of the second clock signal and the enabling time of the first clock signal are non-overlapped, and the second clock signal is in opposite phase with respect to the first clock signal.

* * * * *